(12) United States Patent
Girardi et al.

(10) Patent No.: US 9,667,268 B2
(45) Date of Patent: *May 30, 2017

(54) METHOD FOR DIGITAL ERROR CORRECTION FOR BINARY SUCCESSIVE APPROXIMATION ANALOG-TO-DIGITAL CONVERTER (ADC)

(71) Applicant: STMicroelectronics International N.V., Amsterdam (NL)

(72) Inventors: Francesca Girardi, Cesano Maderno (IT); Alberto Minuti, Caorso Piacenza (IT); Germano Nicollini, Piacenza (IT); Marco Zamprogno, Cesano Maderno (IT)

(73) Assignee: STMicroelectronics International M.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/253,348

(22) Filed: Aug. 31, 2016

(65) Prior Publication Data

US 2016/0373129 A1     Dec. 22, 2016

Related U.S. Application Data

(63) Continuation of application No. 14/559,178, filed on Dec. 3, 2014, now Pat. No. 9,473,162.

(30) Foreign Application Priority Data

Dec. 6, 2013   (IT) .............................. MI2013A2037

(51) Int. Cl.
*H03M 1/38*     (2006.01)
*H03M 1/46*     (2006.01)
(Continued)

(52) U.S. Cl.
CPC ............. *H03M 1/46* (2013.01); *H03M 1/001* (2013.01); *H03M 1/069* (2013.01);
(Continued)

(58) Field of Classification Search
CPC ........... H03M 1/66; H03M 1/46; H03M 1/001
(Continued)

(56) References Cited

U.S. PATENT DOCUMENTS 4,196,420 A    4/1980    Culmer et al.
5,262,779 A    11/1993   Sauer
(Continued)

OTHER PUBLICATIONS

Chen et al., "A 3mW 12b 10MS/s Sub-Range SAR ADC," *IEEE Asian Solid-State Circuits Conference*, Taipei, Taiwan, Nov. 16-18, 2009, pp. 153-156.

(Continued)

*Primary Examiner* — Peguy Jean Pierre
(74) *Attorney, Agent, or Firm* — Seed IP Law Group

(57) ABSTRACT

An analog input voltage is converted to a digital code by, generating a first set of confirmed bits based on a first series of comparisons of an output of a digital-to-analog converter with the analog input voltage and generating a second set of confirmed bits based on a second series of comparisons of the output of the digital-to-analog converter with the analog input voltage. The first set of confirmed bits is independent of the second series of comparisons. The bits of the digital output code corresponding to the analog input voltage are generated based on the first set of confirmed bits, the second set of confirmed bits and a constant value representative of a voltage shift introduced in the digital-to-analog converter between the first series of comparisons and the second series of comparisons.

19 Claims, 4 Drawing Sheets

(51) Int. Cl.
  *H03M 1/06* (2006.01)
  *H03M 1/68* (2006.01)
  *H03M 1/00* (2006.01)
  *H03M 1/08* (2006.01)
  *H03M 1/10* (2006.01)
  *H03M 1/12* (2006.01)
  *H03M 1/76* (2006.01)
  *H03M 1/80* (2006.01)

(52) U.S. Cl.
  CPC ....... *H03M 1/0617* (2013.01); *H03M 1/0845* (2013.01); *H03M 1/1071* (2013.01); *H03M 1/124* (2013.01); *H03M 1/687* (2013.01); *H03M 1/468* (2013.01); *H03M 1/765* (2013.01); *H03M 1/804* (2013.01)

(58) Field of Classification Search
  USPC ........ 341/155, 144, 163, 118, 120, 145, 161
  See application file for complete search history.

(56) References Cited

U.S. PATENT DOCUMENTS 7,379,012 B2   5/2008   Sutardja
8,502,723 B2   8/2013   Chen et al.

OTHER PUBLICATIONS

Confalonieri et al., "A 2.7mW 1MSps 10b Analog-to-Digital Converter with Built-in Reference Buffer and 1LSB Accuracy Programmable Input Ranges.," *Proceedings of the 30$^{th}$ European Solid-State Circuits Conference 2004*, pp. 255-258.

Kuttner, "A 1.2V 10b 20MSample/s Non-Binary Successive Approximation ADC in 0.13 μm CMOS," *ISSCC 2002*, Session 10.6, 2002. (2 pages).

Shrivastava, "12-bit non-calibrating noise-immune redundant SAR ADC for System-on-a-chip.," *Proceedings of the IEEE International Symposium on Circuits and Systems 2006*, pp. 1515-1518.

Tong et al., "High speed, high resolution and low power approaches for SAR A/D converter," *Proceedings of the 5$^{th}$ International Conference on Wireless Communications, Networking and Mobile Computing 2009*, 5 pages.

| Weight | $2^N$ | $2^{N-1}$ | ... | $2^P$ | ... | $2^{N-M}$ | ... | $2^2$ | $2^1$ | $2^0$ |
|---|---|---|---|---|---|---|---|---|---|---|
| B | $b_M$ | $b_{M-1}$ | ... | ... | ... | $b_0$ | | | | |
| C | | | | $c_P$ | ... | $c_{N-M}$ | ... | $c_2$ | $c_1$ | $c_0$ |

*FIG. 2*

METHOD FOR DIGITAL ERROR CORRECTION FOR BINARY SUCCESSIVE APPROXIMATION ANALOG-TO-DIGITAL CONVERTER (ADC)

BACKGROUND

Technical Field

The present disclosure relates to the field of Analog-to-Digital Converters (ADCs).

Description of the Related Art

In many electronic applications, a measure of analog signals is required. Usually, a General-Purpose Analog-to-Digital Converter or GPADC is used to convert such analog signals from the analog domain to the digital domain while measuring them. One of these electronic applications is, for example, mobile phones wherein many analog signals have to be continuously monitored to keep the microprocessor of the mobile phone device aware of the state of the device itself.

Particularly, analog-to-digital (A/D) converters with Successive Approximation Register (SAR) charge redistribution are widely used for such applications.

Even if SAR A/D converters have usually good performances in terms of conversion speed, in many applications is nowadays often desirable that such converters have also a resolution of 12 or up to 14 bits in order to increase precision in the measurements.

To overcome related problems emerging with converters having increased resolution, such as reduction of the settling time of analog voltages or noise immunity constraints, known solutions provide for implementing some expedients into digital blocks without incrementing the performances of analog blocks. In order to preserve performances of the converter, methods for calibrating or correcting errors into the digital domain have to be used. Some of these methods are indicated as redundancy techniques by the person skilled in the art.

As known, a traditional SAR algorithm for an N-bit A/D converter schedules N comparisons done in a row, with a bit in the output code defined at the end of each comparison, starting from the Most Significant Bit (MSB) and down to the Least Significant Bit (LSB). By applying a redundancy method to the same N-bit SAR A/D converter, the comparisons to be scheduled are more than N in order to correct possible errors that might occur because of noise, disturbances, or lack of an adequate settling time of the voltages that have to be compared.

However, the redundancy techniques known in the art are almost always generic, e.g., they are not linked to any particular A/D converter topology. As a consequence, applying a known redundancy technique to an existing SAR A/D converter would require for the designer heavy and time-wasting modifications on the original topology and layout of the converter itself.

In addition, contrary to a conventional SAR algorithm, the redundancy techniques known in the art require additional processing to be performed by the digital controller of the converter during the conversion to determine a correct code to be compared. This can lead to meta-stability problems, whose aftermaths are not always easy to foresee and minimize.

BRIEF SUMMARY

In an embodiment, a method for correcting decision errors in a N+1 bits Successive Approximation Register analog-to-digital (A/D) converter, comprises: generating by a register and control logic unit a first binary code including M+1 bits and at least a second binary code including N−M+1 bits; carrying out a first binary decision SAR processing on the bits of the first binary code by a first digital to analog conversion block to generate a first voltage to be compared with an input voltage to be converted for obtaining a first segment of M+1 confirmed bits; carrying out a second binary decision SAR processing on the bits of the at least second binary code by a second digital to analog conversion block to generate a second voltage to be compared with said input voltage for obtaining a second segment of N−M+1 confirmed bits, said second binary decision SAR processing being carried out without changing the status of the bits of the first segment so that the whole electrical status of the first segment of M+1 confirmed bits is kept unchanged for the rest of the conversion; making redundant decision by keeping a same weight for the Least Significant Bit of the first binary code and for the Most Significant Bit of the second binary code, along with the introduction of a voltage shift corresponding to half of a previous weigh in the analog-to-digital (A/D) converter; generating a final digital output code on the basis of the digital codes of the first segment of confirmed bits, the digital codes of the second segment of confirmed bits and a constant term indicative of said voltage shift. In an embodiment, the generating a final digital output code is evaluated according to the following formula:

$$R<N:0> = B'<M:0>*2^{N-M} + C'<N-M:0> - 2^{N-M-1},$$

wherein
  $R<N:0>$ represents the final digital output code;
  $B'<M:0>$ represents the first segment of confirmed bits;
  $C<N-M:0>$ represents the second segment of confirmed bits,
and wherein it is intended:

$$X<y:0> = \Sum_{i=0}^{y} X(i) \cdot 2^i.$$

In an embodiment, the method comprises conveying said first binary code including M+1 bits on a first digital bus and conveying said at a least second binary code including N−M+1 bits on a second digital bus separated from the first bus. In an embodiment, the method comprises conveying said first segment of confirmed bits $B'<M:0>$ on the first digital bus and conveying said second segment of confirmed bits on the second digital bus. In an embodiment, said first and second digital bus operate as if they were traditional SAR buses in which, during the conversion process, only one bit of the bus is raised at the beginning of each tentative. In an embodiment, the obtaining the first and the second segment of confirmed bits comprises: processing a logic signal representative of the result of comparison of the sum of said first and second voltages with the input voltage; generating the first segment of M+1 confirmed bits and the second segment of N−M+1 confirmed bits as result of the processing step.

In an embodiment, a N+1 bits Successive Approximation Register (SAR) analog-to-digital (A/D) converter comprises: a digital to analog conversion module comprising a first and a second digital to analog conversion block; a register and control logic unit configured to generate a first binary code to be provided to the input of the first conversion block through a first digital bus $B<M:0>$ and to generate at least a second binary code to be provided to the input of the second conversion block through a second digital bus; a comparator having a first input terminal to receive an input voltage and a second input terminal which is operatively connected to output terminals of the first and second conversion blocks, the first digital to analog conversion block being configured to carry out a first binary decision SAR processing on the bits of the first binary code to allow the generation of a first segment of confirmed bits by the register and control logic unit, the second digital to analog conversion block being configured to carry out a second binary decision SAR processing on the bits of the at least second binary code to allow the generation of a second segment of confirmed bits by the register and control logic unit, said second binary decision SAR processing being carried out without changing the status of the bits of the first segment so that the whole electrical status of the first segment of M+1 confirmed bits is kept unchanged for the rest of the conversion; said register and control logic unit being configured to making redundant decision by keeping a same weight for the Least Significant Bit of the first binary code and for the Most Significant Bit of the second binary code, along with the introduction of a voltage shift corresponding to half of a previous weigh in the analog-to-digital (A/D) converter. In an embodiment, the digital to analog conversion module comprises an adder/subtractor block interposed between the output terminals of the first and second conversion block and the second input terminal of the comparator. In an embodiment, the digital to analog conversion module comprises a shift functional block connected between the register and control logic unit and the above mentioned adder/subtractor block to generate the voltage shift to be provided to the adder/subtractor block on the basis of an activation signal generated by the control logic unit. In an embodiment, said digital to analog conversion module comprises a capacitive-resistive digital-to-analog converter including capacitive upper arrays, capacitive lower arrays and a resistive sub-lower array.

In an embodiment, a method comprises: generating a first binary code having M+1 bits, M being an integer greater than 1; generating a second binary code having N−M+1 bits, N being an integer greater than M; carrying out a first binary decision using successive approximation register (SAR) processing on the bits of the first binary code by a first digital to analog conversion block of an analog to digital converter to generate a first voltage to be compared with an input voltage to be converted; generating a first segment of M+1 confirmed bits; carrying out a second binary decision using SAR processing on the bits of the second binary code by a second digital to analog conversion block of the analog to digital converter to generate a second voltage to be compared with said input voltage; generating a second segment of N−M+1 confirmed bits, wherein the first segment of M+1 confirmed bits are independent of the second binary decision processing; assigning a weight to a Least Significant Bit (LSB) of the first binary code; assigning the weight to a Most Significant Bit (MSB) of the second binary code; providing a voltage shift corresponding to half of the assigned weight in the analog-to-digital (A/D) converter; and generating a digital output code based on the first segment of confirmed bits, the second segment of confirmed bits and a constant term corresponding to said voltage shift. In an embodiment, the digital output code is based on the following formula:

$$R<N:0>=B'<M:0>*2^{N-M}+C'<N-M:0>-2^{N-M-1},$$

wherein
R<N:0> represents the generated digital output code;
B'<M:0> represents the first segment of confirmed bits;
C<N−M:0> represents the second segment of confirmed bits,
and:

$$X<y:0>=\Sigma_{i=0}^{y}X(i)\cdot 2^{i}.$$

In an embodiment, the method comprises conveying said first binary code having M+1 bits on a first digital bus and conveying said second binary code having N−M+1 bits on a second digital bus separated from the first digital bus. In an embodiment, the method comprises conveying said first segment of confirmed bits on the first digital bus and conveying said second segment of confirmed bits on the second digital bus. In an embodiment, during the conversion process, only one bit of the first digital bus is raised at a beginning of each tentative. In an embodiment, generating the first and the second segments of confirmed bits comprises: processing a logic signal representative of a result of comparison of a sum of said first and second voltages with the input voltage; generating the first segment of M+1 confirmed bits and the second segment of N−M+1 confirmed bits as result of the processing step.

In an embodiment, a method comprises: generating a first set of confirmed bits based on a first series of comparisons of an output of a digital-to-analog converter with an analog input voltage; generating a second set of confirmed bits based on a second series of comparisons of the output of the digital-to-analog converter with the analog input voltage, wherein the first set of confirmed bits is independent of the second series of comparisons; and generating bits of a digital output code corresponding to the analog input voltage based on the first set of confirmed bits, the second set of confirmed bits and a constant value representative of a voltage shift introduced in the digital-to-analog converter between the first series of comparisons and the second series of comparisons. In an embodiment, the digital output code is based on the following formula:

$$R<N:0>=B'<M:0>*2^{N-M}+C'<N-M:0>-2^{N-M-1},$$

wherein
R<N:0> represents the generated digital output code;
B'<M:0> represents the first set of confirmed bits;
C<N−M:0> represents the second set of confirmed bits,
and:

$$X<y:0>=\Sigma_{i=0}^{y}X(i)\cdot 2^{i}.$$

In an embodiment, the method comprises: applying a first binary code having M+1 bits to a first digital-to-analog conversion circuit of the digital-to-analog converter, M being an integer greater than 1; and applying a second binary code having N−M+1 bits to a second digital-to-analog conversion circuit of the digital-to-analog converter, N being an integer greater than M. In an embodiment, the method comprises: generating a third set of confirmed bits based on a third series of comparisons of the output of a digital-to-analog converter with an analog input voltage, wherein the first set of confirmed bits is independent of the third series of comparisons and the digital output code is based on the first set of confirmed bits, the second set of confirmed bits, the third set of confirmed bits, and the constant term representative of the voltage shift.

In an embodiment, a system comprises: a digital-to-analog converter comprising first and second digital-to-analog conversion circuits, a voltage shifter and an adder; a comparator having: a first input terminal, which, in operation, receives an analog input voltage; a second input terminal, which, in operation, receives an output of the digital-to-analog converter; and an output terminal, which, in operation, outputs a first series of results of comparisons of the analog input voltage to the output of the digital-to-analog converter and a second series of results comparisons of the analog input voltage to the output of the digital-to-analog converter; and control logic which, in operation: generates a first binary code to input to the first digital-to-analog conversion circuit through a first digital bus; generates at least a second binary code to input to the second digital to analog conversion circuit through a second digital bus; generates a control signal which, in operation, causes the voltage shifter to apply a voltage shift to the adder between the first set of comparisons and the second set of comparisons; generates a first set of confirmed bits based on the first series of results; generates a second set of confirmed bits based on the second series of results, wherein the first set of confirmed bits is independent of the second series of results. In an embodiment, said digital-to-analog converter comprises capacitive-resistive circuitry including capacitive upper arrays, capacitive lower arrays and a resistive sub-lower array. In an embodiment, the system comprises post-processing logic which, in operation, generates bits of a digital output code corresponding to the analog input voltage based on the first set of confirmed bits, the second set of confirmed bits and a constant value representative of the voltage shift applied to the adder.

In an embodiment, a device comprises: an input, which, in operation, receives results of comparisons of an analog input voltage to an output of a digital-to-analog converter; and circuitry coupled to the input, which, in operation: generates a first set of confirmed bits based on a first series of comparisons of the output of the digital-to-analog converter with the analog input voltage; generates a second set of confirmed bits based on a second series of comparisons of the output of the digital-to-analog converter with the analog input voltage, wherein the first set of confirmed bits is independent of the second series of comparisons; and generates bits of a digital output code corresponding to the analog input voltage based on the first set of confirmed bits, the second set of confirmed bits and a constant value representative of a voltage shift introduced in the digital-to-analog converter between the first series of comparisons and the second series of comparisons. In an embodiment, the digital output code is based on the following formula:

$$R<N:0>=B'<M:0>*2^{N-M}+C'<N-M:0>-2^{N-M-1},$$

wherein

R<N:0> represents the generated digital output code;
B'<M:0> represents the first set of confirmed bits;
C<N-M:0> represents the second set of confirmed bits, and:

$$X<y:0>=\Sigma_{i=0}^{y}X(i)\cdot 2^i.$$

In an embodiment, the device comprises: a comparator, which, in operation, compares the analog input voltage to the output of the digital to analog converter; and the digital-to-analog converter, wherein the circuitry, in operation: applies a first binary code having M+1 bits to a first digital-to-analog conversion circuit of the digital-to-analog-converter, M being an integer greater than 1 and the first set of confirmed bits being a set of M+1 bits; and applies a second binary code having N−M+1 bits to a second digital-to-analog conversion circuit of the digital-to-analog conversion circuit of the digital-to-analog converter, N being an integer greater than M and the second set of confirmed bits being a set of N−M+1 bits. In an embodiment, the digital-to-analog converter comprises a voltage shifter and an adder, and the circuitry, in operation, generates a signal to cause the voltage shifter to apply the voltage shift to the adder after the first series of comparisons.

BRIEF DESCRIPTION OF THE SEVERAL VIEWS OF THE DRAWINGS

Example features and advantages of various embodiments of the present disclosure will become apparent from the following detailed description of exemplary but non-limiting embodiments thereof, as illustrated in the attached figures, in which:

FIG. 2 shows an embodiment of a table indicating weights associated to a first binary code and at least a second binary code processed by the Successive Approximation Register (SAR) analog-to-digital (A/D) converter of FIG. 1;

DETAILED DESCRIPTION

Figure 1:
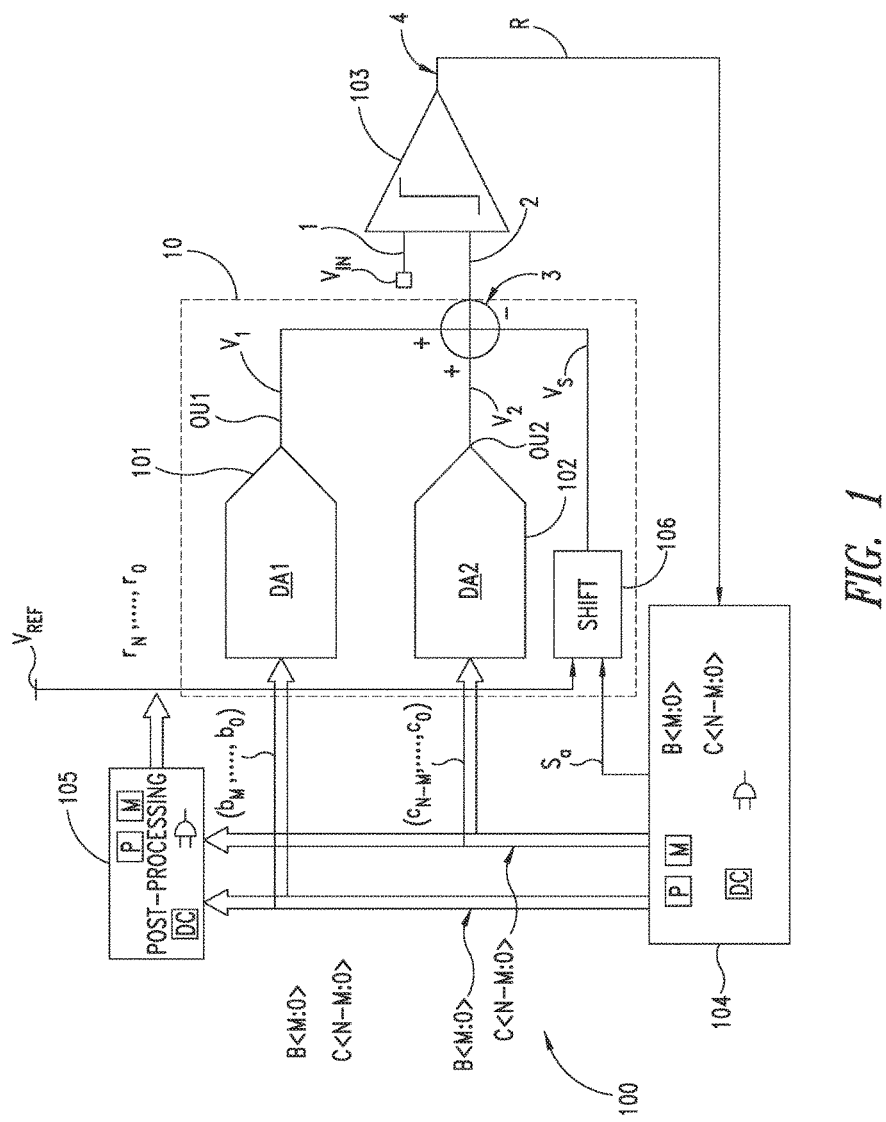
FIG. 1 shows schematically a functional block structure of a Successive Approximation Register (SAR) analog-to-digital (A/D) converter implementing an embodiment of a method.

With reference to FIG. 1, a functional block structure of an N+1 bit Successive Approximation Register (SAR) analog-to-digital (A/D) converter implementing an embodiment of a method is indicated with the reference number 100. In the following, the SAR analog-to-digital converter 100 is also indicated, simply, as A/D converter.

Such A/D converter 100 can be used in many electronic applications wherein a conversion of analog voltage signals from the analog domain to the digital domain is required, for example in portable communication apparatuses, such as mobile phones, smart-phones or tablets.

Particularly, with reference to FIG. 1, the A/D converter 100 comprises a digital-to-analog conversion module or converter 10 which comprises a first 101 and a second 102 digital-to-analog (DA1, DA2) conversion block.

In addition, the A/D converter 100 comprises a register and control logic unit 104 configured to generate a first binary code $b_M, b_{M-1}, \ldots, b_0$ including M+1 bits and at least a second binary code $c_{N-M}, \ldots, c_0$ including N−M+1 bits. In more detail, the first binary code $b_M, b_{M-1}, \ldots, b_0$ is provided to the input of the first DA1 conversion block 101 through a first digital bus B<M:0> and the at least a second binary code $c_{N-M}, \ldots, c_0$ is provided to the input of the second DA2 conversion block 102 through a second digital bus C<N−M:0>, respectively, which is separated from the first bus.

In addition, the first 101 and the second 102 conversion block comprise a first OU1 and a second OU2 output terminal, respectively, to generate first V1 and second V2 voltages. These first V1 and second V2 voltages can assume each a plurality of voltage levels corresponding to the first binary code $b_M, b_{M-1}, \ldots, b_0$ and to the second binary code $c_{N-M}, \ldots, c_0$, respectively, provided at the inputs of digital-to-analog conversion blocks 101, 102.

Moreover, the A/D converter 100 comprises a comparator 103 having a first input terminal 1 to receive an input voltage $V_{IN}$ to be converted and a second input terminal 2.

Output terminals OU1, OU2 of the first 101 and of the second 102 conversion block are operatively associated to the second input terminal 2 of the comparator 103. In more detail, both output terminals OU1, OU2 are connected to the second input terminal 2 of the comparator 103 through an adder/subtractor block 3.

The comparator 103 further comprises a respective output terminal 4 which is feedback connected to the register and control logic unit 104, for example with a single bit wire. Particularly, through such feedback connection the comparator 103 is configured to provide to the logic unit 104 a respective logic signal R representing the result of comparison. The logic unit 104 is configured to process such received logic signal R to generate a first segment of M+1 confirmed bits B'<M:0> and a second segment of N−M+1 confirmed bits C'<N−M:0>. As illustrated, the logic unit 104 comprises circuitry, such as a processor P, a memory M, discrete circuitry DC and one or more logic gates, which may be employed alone or in various combinations to implement the logic unit 104.

It should be observed that, in general, both the first segment of M+1 confirmed bits B'<M:0> and the second segment of N−M+1 confirmed bits C'<N−M:0> are related to the comparison of the input voltage $V_{IN}$ with a sum of the first voltage V1 and the second voltage V2. The first segment of confirmed bits B'<M:0> depends on the comparison of the first voltage V1 with the input voltage $V_{IN}$, the second segment of confirmed bits C'<N−M:0> depends on the comparison of the second voltage V2 with the input voltage $V_{IN}$.

In addition, the digital to analog conversion module 10 comprises a shift functional block 106 connected between the register and control logic unit 104 and the above mentioned adder/subtractor block 3. Such shift block 106 is configured to generate a voltage shift Vs to be provided to the adder/subtractor block 3 on the basis of an activation signal Sa generated by the control logic unit 104 itself. More particularly, the voltage shift Vs is configured to be subtracted to the sum of the first V1 and second V2 voltages arriving into the adder/subtractor block 3 before they are provided to the second input terminal 2 of the comparator 103.

Moreover, a reference voltage $V_{REF}$ is provided both to the inputs of the first 101 and second 102 conversion block and to the shift functional block 106.

Moreover, the A/D converter 100 comprises a post processing module 105 electrically connected to the register and control logic unit 104 through both the first digital bus B<M:0> and the second digital bus C<N−M:0>. Particularly, through these buses, the post processing module 105 is configured to receive both the first segment of M+1 confirmed bits B'<M:0> and the second segment of N−M+1 confirmed bits C'<N−M:0> generated by the register and control logic unit 104. The post processing module 105 is configured to generate a final digital output code of N+1 bits $r_N, r_{N-1}, \ldots, r_0$ by adding the digital codes of the first segment of confirmed bits B'<M:0> to the second segment of confirmed bits C'<N−M:0> with code overlap and also by subtracting a constant term which takes into account the above mentioned shift. As illustrated, the post-processing module 105 comprises circuitry, such as a processor P, a memory M, discrete circuitry DC and one or more logic gates, which may be employed alone or in various combinations to implement the post-processing module 105. In some embodiments, the logic unit 104 and the post-processing module 105 may be combined.

An exemplary embodiment of a circuit structure which may be employed in the embodiment of FIG. 1 is described with reference to FIG. 3. Particularly, such circuit structure comprises a capacitive-resistive digital-to-analog converter 10 also indicated as pseudo-differential C-R DAC or C-R DAC by those skilled in the art.

For example, this pseudo-differential C-R DAC 10 comprises two main arrays, particularly a SAR array 11 and a GND array 12. Each of these arrays 11, 12 is connected to a dedicated input terminal A,B of the comparator 103. The SAR array 11 comprises an upper array 11a including capacitors 32C, 16C, 8C, 4C, 2C, C, C each having a respective terminal connected to the first dedicated input terminal A of comparator 103. In addition, the SAR array 11 comprises a lower array 11b including capacitors 8C, 4C, 2C, C each having a respective terminal connected to a first common node F.

The other terminal of each capacitor included in the SAR array 11 is selectively connectable to the input voltage $V_{IN}$, to the reference voltage $V_{REF}$ or to a ground potential GND.

The GND array 12 comprises an upper array 12a including capacitors 32C, 16C, 8C, 4C, 2C, C, C each having respective terminals connected to the second dedicated input terminal B of comparator 103 and to the ground GND potential. Moreover, such GND array 12 comprises a lower array 12b including capacitors 8C, 4C, 2C, C that have respective terminals connected to the ground potential GND and to a second common node F'.

The C-R DAC 10 further comprises a resistive sub-lower array 13 or voltage divider.

Figure 3:
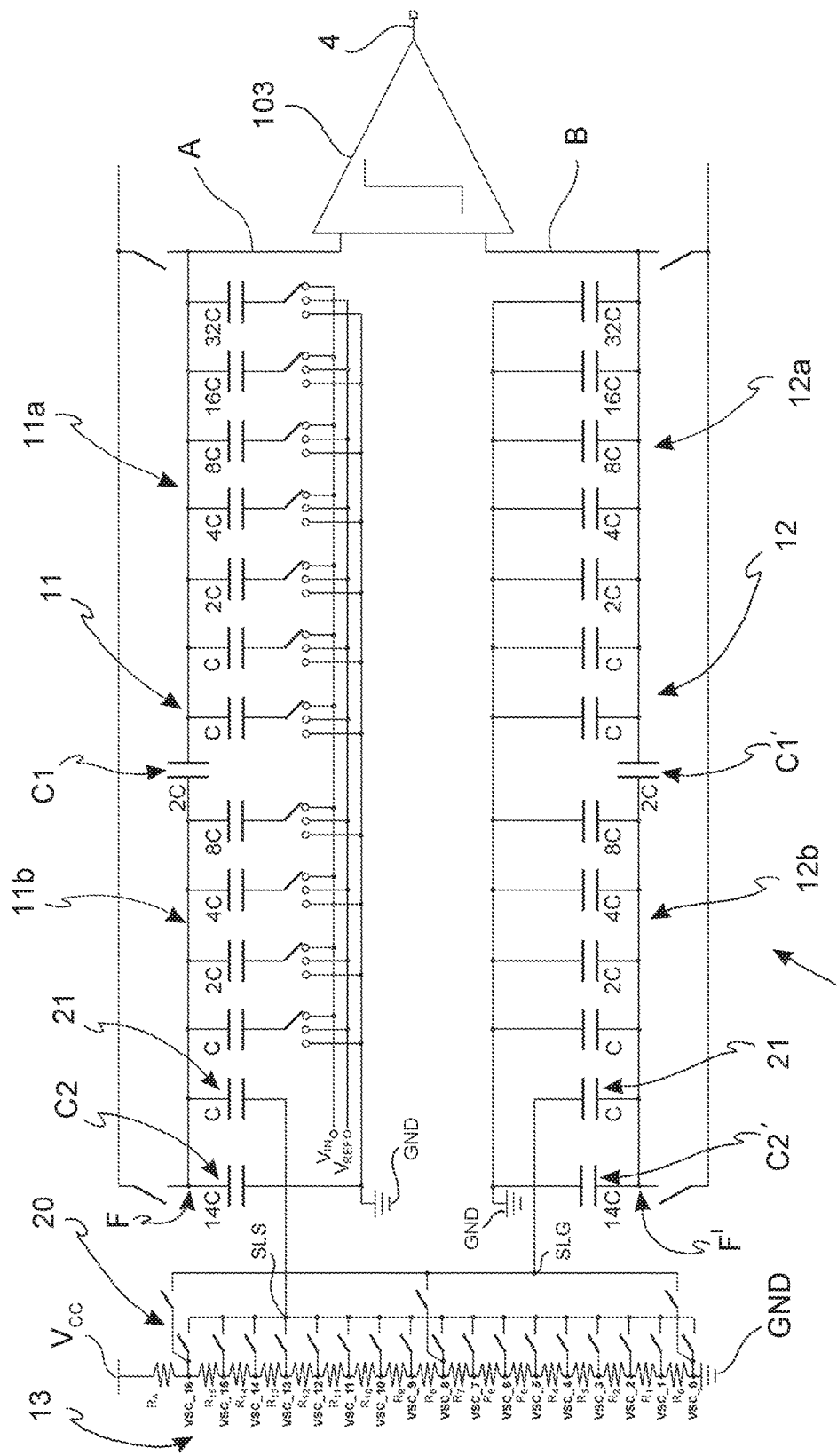
FIG. 3 shows a schematic circuit structure of a known capacitive-resistive DAC and comparator included in the analog-to-digital converter of FIG. 1.

In the description which follows, reference is made to the circuit structure of FIG. 3 known in the art, only with the aim to better explain the way of operating of the proposed method and without any limiting purpose. In fact, embodiments of the methods disclosed herein can be applied also to A/D converters having a different number of bits, as well as a different partitioning between the upper arrays 11a, 12a, the lower arrays 11b, 12b and the sub-lower array 13.

Particularly, the C-R DAC 10 comprises a first capacitor C1, C1' having an integer value equal to 2C which is used to improve the inter-array matching. In addition, a second capacitor C2, C2', having an integer value equal to 14C, is connected in both arrays 11, 12 from the common nodes F, F' of the capacitive lower arrays 11b, 12b to the ground potential GND.

The sub-lower array 13 includes, particularly, a resistive voltage divider connected from a power supply Vcc of the A/D converter and the ground potential GND. The sub-lower array 13 comprises a plurality of resistors, particularly 17 resistors R0, R1, . . . , R15, RA series connected with each other. In addition, the resistors from R0 to R15 are equally sized so that to obtain partitioned voltages having voltage values of:

$$\text{VSC\_}(i) = \left(\frac{i}{16}\right) \cdot V_{REF} \tag{1}$$

wherein i=1, 2, . . . , 16 and VSC_(0)=GND. In more detail, resistors R0, R1, . . . , R15 are sized so to obtain $V_{sc\_16} = V_{REF}$.

The resistive voltage divider 13 can be supplied by whatever supply voltage Vcc, in order to avoid draining current from the reference voltage $V_{REF}$. The precision of these values, and in turn the accuracy of the four LSBs, is directly linked to the precision of power supply Vcc, which may be, for example, about +/−3%. The voltages generated by the sub-lower array 13 are applied to both the capacitive lower array 11b and the capacitive lower array 12b of the DAC through a plurality of switches 20 connecting the resistors R0, R1, . . . , R15 to a first SLS and to a second SLG common node which are directly connected to respective third capacitors 21 each having an integer value equal to C.

It should be observed that the reference voltage $V_{REF}$ in FIG. 3 generally corresponds to an output voltage generated by a buffer. Such output voltage has generally a limited sourcing capability to charge the capacitors of C-R DAC 10. This leads to longer settling times, especially during the first SAR tentatives since the capacitors of the upper array 11a involved in this phase are large. On the other hand, the sub-lower array 13 speeds up the settling times of the last SAR tentatives, provided that the sub-lower array 13 has a sufficient biasing current to guarantee an adequate settling level of the voltage of the third capacitors 21, at the end of a given time.

With reference to FIGS. 1, 2, 3 and 4 an embodiment of a method or algorithm for correcting decision errors in the N+1 bits SAR analog-to-digital A/D converter 100 is described in more detail.

In accordance with the method, the first digital bus B<M:0> controls the capacitors of the upper 11a, 12a and lower 11b, 12b arrays of C-R DAC 10 in the same way as for a classical SAR converter. The second digital bus C<N−M:0>, controls the resistive sub-lower array 13 by acting on the switches 20.

Both digital buses B<M:0> and C<N−M:0> operates as if they were traditional SAR buses. In other words, this means that at the beginning of each tentative, only one bit of the bus is raised and the bit related to the previous tentative is kept to 1 or re-moved to 0 depending on the result of the previous tentative itself. In general, during the SAR phase, which takes place after a input voltage Sampling Phase, the first digital bus B<M:0> represents the tentative code. This code evolves through the scheduled comparisons: after each comparison, one bit of the tentative bus is settled, according to the comparison results. The second digital bus C<N−M:0> operates in the same manner. In this way, advantageously, metastability issues during the SAR phase may be excluded.

The redundancy provided by the proposed method is solved at the end of the SAR phase, where the two buses are processed together by the post processing module 105 to generate the final digital output code of N+1 bits $r_N$, $r_{N−1}$, . . . , $r_0$.

In more detail, in an embodiment, the method comprises a first step of generating by the register and control logic unit 104 the first binary code $b_M$, $b_{M−1}$, . . . , $b_0$ including M+1 bits and at least the second binary code $c_{N−M}$, . . . , $c_0$ including N−M+1 bits.

The method further comprises carrying out a first binary decision SAR processing on the bits of the first binary code $b_M$, $b_{M−1}$, . . . , $b_0$ by the first digital to analog conversion block 101 to generate the first voltage V1. In this way, the first segment of M+1 confirmed bits B'<M:0> generated by the register and control logic unit 104 depends on the comparison of the first voltage V1 with the input voltage $V_{IN}$.

Moreover, the method comprises carrying out a second binary decision SAR processing on the bits of the at least second binary code $c_{N−M}$, . . . , $c_0$ by the second digital to analog conversion block 102 to generate the second voltage V2. In this way, the second segment of N−M+1 confirmed bits C<N−M:0> generated by the register and control logic unit 104 depends on the comparison of the second voltage V2 with the input voltage $V_{IN}$.

It should be observed that, advantageously, the second binary decision SAR processing is carried out without changing the status of the bits of the first segment B'<M:0> of M+1 confirmed bits so that the whole electrical status of such first segment of bits B'<M:0> is kept unchanged for the rest of the conversion.

With reference to FIG. 2, in a further step, the method also employs the operation of making redundant decision by keeping a same weight, e.g., $2^{N−M}$, both for the Least Significant Bit b0 of the first binary code $b_M$, $b_{M−1}$, . . . , $b_0$ and for the Most Significant Bit $c_{N−M}$ of the second binary code $c_{N−M}$, . . . , $c_0$.

This method step further comprises the operation of introducing a voltage shift Vs corresponding to half of a previous weigh, e.g., $2^{N−M−1}$ in the passage from the Least Significant Bit b0 of the first binary code $b_M$, $b_{M−1}$, . . . , $b_0$ to the Most Significant Bit $c_{N−M}$ of the second binary code $c_{N−M}$, . . . , $c_0$. It should be observed that the two operations above are distinct from each other, but occur simultaneously.

In this way, the proposed method facilitates ensuring, that the search range extension is maintained unchanged in the passage from the first 101 to the second 102 conversion block. This occurrence gives to next comparison the faculty of correcting possible comparison errors done in the former tentatives.

In addition, the proposed method facilitates ensuring that the center of this search range is shifted by an amount equal to half of the interval itself.

Furthermore, the method comprises the step of generating the final digital output code $r_N$, $r_{N−1}$, . . . , $r_0$ by adding digital codes obtained from the first segment of confirmed bits B'<M:0> and the second segment C<N−M:0> of confirmed bits with code overlap and also by subtracting a constant term which takes into account the above mentioned shift.

In an embodiment, such step of generating a final digital output code $r_N$, $r_{N−1}$, . . . , $r_0$ is evaluated according to the following equation:

$$R<N:0>=B'<M:0>*2^{N−M}+C<N−M:0>−2^{N−M−1}, \qquad (2)$$

wherein

R<N:0> represents the final digital output code comprising N+1 bits;

B'<M:0> represents the first segment of confirmed bits comprising M+1 bits;

C<N−M:0> represents the second segment of confirmed bits comprising N−M+1 bits.

In equation (2) it is intended:

$$X<y:0>=\Sigma_{i=0}^{y}X(i)\cdot 2^i \qquad (3)$$

In view of the above, by assuming N=13 and M=9, N−M=4, the bits of the first binary code are $b_9$, $b_8$, . . . , $b_1$, $b_0$, and the bits of the second binary code are $c_4$, . . . , $c_0$.

With reference to the first binary code $b_9$, $b_8$, . . . , $b_1$, b0, from the first tentative concerning the MSB $b_9$ until the end of the $10^{th}$ tentative, the changes in the first digital bus B<9:0> are in accordance with the traditional SAR algorithm. In this phase, the second digital bus C<4:0> is not yet used.

Moreover, with reference to the second binary code $c_4$, $c_3$, . . . , $c_1$, $c_0$, the second digital bus C<4:0> is managed by the control logic 104 according to the results R provided by comparator 103, just like it was a classical SAR algorithm from the $12^{th}$ tentative until the end of the conversion process. In this case, the status of the bits of the first digital bus B<9:0> is not changed anymore, e.g., the first segment of M+1 confirmed bits B'<M:0> is kept unchanged for the rest of the conversion.

Figure 4:
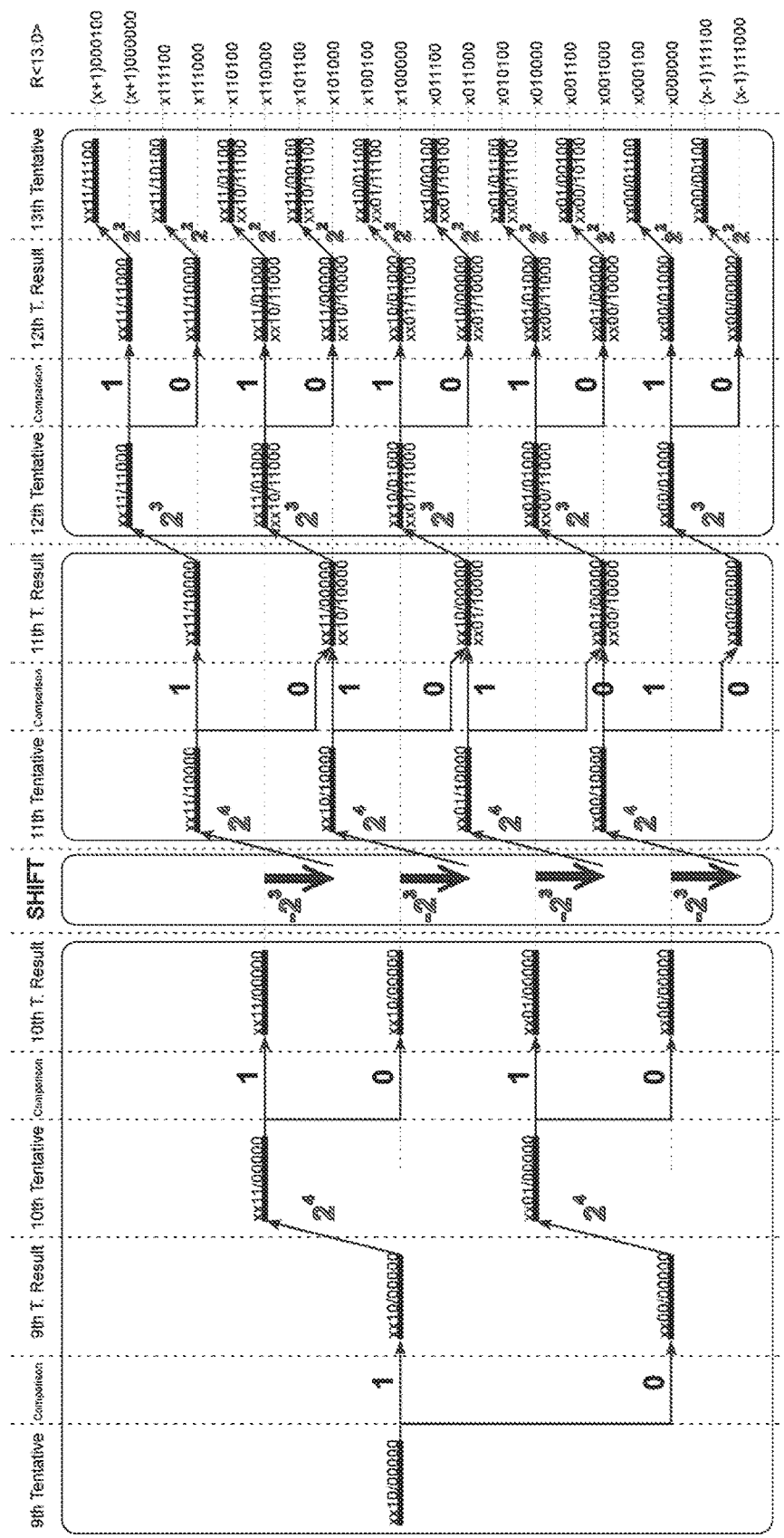
FIG. 4 shows schematically a diagram illustrating an exemplary implementation of an embodiment of a method.

In the present example, the redundancy is implemented with reference to the $10^{th}$ and $11^{th}$ tentatives. Reference is made to FIG. 4.

In more detail, looking at the $10^{th}$ tentative, the LSB $b_0$ is set to logic level 1. This tentative voltage level corresponds to the result of the $9^{th}$ tentative increased by $2^4$ codes (LSBs). Following the result of the comparison, this tentative bit $b_0$ is confirmed or not inside the first digital bus B<9:0>. If not confirmed, the value of B<9:0> after the $10^{th}$ tentative is equal to the value of the previous one, i.e., the $9^{th}$ tentative.

The redundancy operates at the upcoming of the $11^{th}$ tentative, wherein the second digital bus C<4:0> and therefore the sub-lower voltage divider 13 of FIG. 3, come into play.

In more detail, with reference to FIG. 4, as soon as the MSB of the second digital bus C<4:0>, i.e., the first bit $c_4$, is set to the logic value 1, the $11^{th}$ tentative voltage level is raised $2^3$ LSBs over the previous level, as would be expected. The difference from a classical SAR is that, in case this tentative bit is not confirmed, the value of the resulting code at the end of the $11^{th}$ tentative, before to raise up the bit related to the $12^{th}$ tentative, is $2^3$ levels lower than the result of the previous tentative (i.e., the $10^{th}$). In other words, this tentative has a weight equal to $2^4$ LSBs which is double with respect to the expected weight, i.e., $2^3$ LSBs.

This extension range attainment is through a code shift equal to $2^3$ levels in the transition between the $10^{th}$ and the $11^{th}$ tentative, in the same time in which the bit of the $11^{th}$ tentative itself is raised up (according to classical SAR approach).

This operation makes symmetric the range of the $11^{th}$ tentative with respect to the value achieved at the end of the $10^{th}$ tentative.

In the present example, the $11^{th}$ tentative appears to be a redundant one, because it can correct possible errors done in the previous ten tentatives present in the first bus as long as they are less than 8 LSBs.

At the end of the SAR phase, the resulting code is evaluated by the equation (2):

$$R<13:0>=B'<9:0>*2^4+C'<4:0>-2^3.$$

From the equation above, it is clear that the weights of $10^{th}$ and $11^{th}$ tentatives are the same, but, the $11^{th}$ one implies a voltage shift of half that weight, i.e., $-2^3$ which is suitable to compensate for the voltage shift introduced by the shift block 106.

The method and the corresponding redundancy has been implemented by the circuit structure of FIG. 3 without requesting any extra analog area.

Table I reports voltage levels associated to the first common node SLS of the sub-lower array 13 as a function of the bits of the second digital bus C<4:0>. In the present case, digital signal SUBLOWERENABLE is 1 during the sub-lower SAR phase and 0 otherwise. Voltage levels associated to the first common node SLS are quite straightforward, with the only peculiarity that they depend on bits $c_2$, $c_1$, $c_0$ and a fourth bit which is the logic OR between bits $c_4$ and $c_3$.

TABLE I

| SUBLOWERENABLE | $C_4$ | $C_3$ | $C_2$ | $C_1$ | $C_0$ | SLS |
|---|---|---|---|---|---|---|
| 0 | 0 | 0 | 0 | 0 | 0 | VSC_0 |
| 1 | 0 | 0 | 0 | 0 | 0 | VSC_0 |
| 1 | 0 | 0 | 0 | 0 | 1 | VSC_1 |
| 1 | 0 | 0 | 0 | 1 | 0 | VSC_2 |
| 1 | 0 | 0 | 0 | 1 | 1 | VSC_3 |
| 1 | 0 | 0 | 1 | 0 | 0 | VSC_4 |
| 1 | 0 | 0 | 1 | 0 | 1 | VSC_5 |
| 1 | 0 | 0 | 1 | 1 | 0 | VSC_6 |
| 1 | 0 | 0 | 1 | 1 | 1 | VSC_7 |
| 1 | 0 | 1 | 0 | 0 | 0 | VSC_8 |
| 1 | 0 | 1 | 0 | 0 | 1 | VSC_9 |
| 1 | 0 | 1 | 0 | 1 | 0 | VSC_10 |
| 1 | 0 | 1 | 0 | 1 | 1 | VSC_11 |
| 1 | 0 | 1 | 1 | 0 | 0 | VSC_12 |
| 1 | 0 | 1 | 1 | 0 | 1 | VSC_13 |
| 1 | 0 | 1 | 1 | 1 | 0 | VSC_14 |
| 1 | 0 | 1 | 1 | 1 | 1 | VSC_15 |
| 1 | 1 | 0 | 0 | 0 | 0 | VSC_8 |
| 1 | 1 | 0 | 0 | 0 | 1 | VSC_9 |
| 1 | 1 | 0 | 0 | 1 | 0 | VSC_10 |
| 1 | 1 | 0 | 0 | 1 | 1 | VSC_11 |
| 1 | 1 | 0 | 1 | 0 | 0 | VSC_12 |
| 1 | 1 | 0 | 1 | 0 | 1 | VSC_13 |
| 1 | 1 | 0 | 1 | 1 | 0 | VSC_14 |
| 1 | 1 | 0 | 1 | 1 | 1 | VSC_15 |
| 1 | 1 | 1 | 0 | 0 | 0 | VSC_8 |
| 1 | 1 | 1 | 0 | 0 | 1 | VSC_9 |
| 1 | 1 | 1 | 0 | 1 | 0 | VSC_10 |
| 1 | 1 | 1 | 0 | 1 | 1 | VSC_11 |
| 1 | 1 | 1 | 1 | 0 | 0 | VSC_12 |
| 1 | 1 | 1 | 1 | 0 | 1 | VSC_13 |
| 1 | 1 | 1 | 1 | 1 | 0 | VSC_14 |
| 1 | 1 | 1 | 1 | 1 | 1 | VSC_15 |

Table II reports voltage levels associated to the second common node SLG of the sub-lower array 13 as a function of the bits of the second digital bus C<4:0>, particularly bits $c_4$ and $c_3$.

TABLE II

| SUBLOWERENABLE | $C_4$ | $C_3$ | SLG |
|---|---|---|---|
| 0 | 0 | 0 | VSC_8 |
| 1 | 0 | 0 | VSC_16 |
| 1 | 0 | 1 | VSC_16 |
| 1 | 1 | 0 | VSC_8 |
| 1 | 1 | 1 | VSC_0 |

Particularly, voltage levels associated to the second common node SLG have the role to implement the redundancy. According to the values of bits $c_4$ and $c_3$, the voltage values of the second common node SLG are configured to introduce a shifting of about 8 LSBs in the comparator input differential voltage. This voltage shift allows "covering" codes that otherwise would be unreachable for the possibilities of a conventional SAR algorithm.

In more detail, during the first ten tentatives the digital signal SUBLOWERENABLE is not set, the first common node SLS is connected to the ground potential GND and the second common node SLG is fixed to VSC_8=$V_{REF}$/2. When the MSB $c_4$ of the second digital bus C<4:0> is set during the $11^{th}$ tentative, also the signal SUBLOWERENABLE is set and remains active until the end of the whole conversion. The first common node SLS is charged to VSC_8=$V_{REF}$/2 producing a voltage up-shift of $2^3$ LSB at the comparator inputs, whereas the voltage at the second common node SLG does not change.

If the setting of MSB bit $c_4$ is not confirmed by the comparator 103, such bit $c_4$ is reset, the first common node SLS returns to the ground potential GND producing a voltage variation of $-2^3$ LSB. The second common node SLG is charged to VSC_16=$V_{REF}$ producing an extra variation of $-2^3$ LSB at the end of the $11^{th}$ tentative, i.e., a total voltage variation of $2^4$ LSB.

On the contrary, if the setting of bit $c_4$ is confirmed by comparator 103, the $12^{th}$ tentative starts by setting the following bit $c_3$. In this case, the voltage at the first common node SLS of the voltage divider 13 does not change, whereas the second common node SLG is discharged to ground GND producing an up-shift of $2^3$ LSB, as expected. From now on, until the end of the conversion, the changes in the second digital bus C<4:0> follow the classical SAR algorithm.

In an embodiment, the proposed method turns an existing SAR A/D converter 100 into a redundancy approach with very little redesign of the analog blocks. For example, one can choose to reduce the current consumption, as well as to increase converter resolution, introducing a redundancy, to address voltage settlement issues that can arise. In an embodiment, voltage settlement issues may be addressed with a few modifications restricted to digital blocks, with no need to update the analog blocks of the A/D converter 100 and with a consequent gain in terms of design time.

In addition, an embodiment facilitates correction of potential comparison errors done in the former tentatives because of a lack of settling time by introducing only one redundant step.

Moreover, an embodiment is very easy to be managed by the register and control logic 104 of the A/D converter 100: the whole method and the corresponding algorithm may be managed as a classical SAR, reducing the risk of metastability issues.

In fact, since at each step of the method only one bit of the digital buses B<M:0>, C<N-M:0> changes, the only risk of metastability is in the above described final calculation performed by post processor 105 in accordance with equation (2). In this case, proper time can be reserved to perform such task, thus drastically reducing the risk associated to metastability.

It should be clear that the generality of the principles of the presented method makes it applicable in different ways. For example, since the least significant capacitances of the upper array 11a of R-C DAC 10 are also involved in a fast settling tentative, a wider correction range could be achieved by introducing a similar redundant step on these capacitors.

Some embodiments may take the form of or include computer program products. For example, according to one embodiment there is provided a computer readable medium including a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some of the systems and/or modules and/or circuits and/or blocks may be implemented or provided in other manners, such as at least partially in circuitry such as firmware and/or hardware, including, but not limited to, one or more application-specific integrated circuits (ASICs), digital signal processors, discrete circuitry, logic gates, standard integrated circuits, state machines, look-up tables, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof. The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
generating, using control logic, a first binary code having M+1 bits, M being an integer greater than 1;
generating, using the control logic, a second binary code having N−M+1 bits, N being an integer greater than M;
carrying out a first binary decision using successive approximation register (SAR) processing on the bits of the first binary code by a first digital to analog conversion block of an analog to digital converter to generate a first voltage to be compared, using a comparator, with an input voltage to be converted;
generating a first segment of M+1 confirmed bits based on the comparison of the first voltage with the input voltage;
carrying out a second binary decision using SAR processing on the bits of the second binary code by a second digital to analog conversion block of the analog to digital converter to generate a second voltage to be compared with said input voltage;
generating a second segment of N−M+1 confirmed bits based on the comparison of the second voltage with the input voltage, wherein the first segment of M+1 confirmed bits do not change based on the second binary decision processing or the second segment of confirmed bits;
assigning a weight to a Least Significant Bit (LSB) of the first binary code;
assigning the same weight to a Most Significant Bit (MSB) of the second binary code;
providing a voltage shift, using an adder, corresponding to half of the assigned weight in the analog-to-digital (A/D) converter; and
generating a digital output code based on the first segment of confirmed bits, the second segment of confirmed bits and a constant term corresponding to said voltage shift.

2. The method of claim 1, wherein the digital output code is based on the following formula:

$$R<N:0>=B'<M:0>*2^{N-M}+C'<N-M:0>-2^{N-M-1},$$

wherein
R<N:0> represents the generated digital output code;
B'<M:0> represents the first segment of confirmed bits;
C<N−M:0> represents the second segment of confirmed bits, and:

$$X<y:0>=\Sigma_{i=0}^{y}X(i)\cdot 2^{i}.$$

3. The method of claim 1, comprising conveying said first binary code having M+1 bits on a first digital bus and conveying said second binary code having N−M+1 bits on a second digital bus separated from the first digital bus.

4. The method of claim 3, comprising conveying said first segment of confirmed bits on the first digital bus and conveying said second segment of confirmed bits on the second digital bus.

5. The method according to claim 3, wherein, during the conversion process, only one bit of the first digital bus is raised at a beginning of each tentative.

6. The method according to claim 1, wherein generating the first and the second segments of confirmed bits comprises:
processing a logic signal representative of a result of comparison of a sum of said first and second voltages with the input voltage;
generating the first segment of M+1 confirmed bits and the second segment of N−M+1 confirmed bits as result of the processing step.

7. A method, comprising:
generating a first set of bits based on a first series of comparisons of an output of a digital-to-analog converter with an analog input voltage;
generating a second set of bits based on a second series of comparisons of the output of the digital-to-analog converter with the analog input voltage, wherein the first set of bits do not change in response to the second series of comparisons or the second set of bits; and
generating bits of a digital output code corresponding to the analog input voltage based on the first set of bits, the second set of bits and a constant value representative of a voltage shift introduced in the digital-to-analog converter between the first series of comparisons and the second series of comparisons, wherein the method includes:
applying a first binary code having M+1 bits to a first digital-to-analog conversion circuit of the digital-to-analog converter, M being an integer greater than 1; and
applying a second binary code having N−M+1 bits to a second digital-to-analog conversion circuit of the digital-to-analog converter, N being an integer greater than M.

8. The method of claim 7, wherein the digital output code is based on the following formula:

$$R<N:0>=B'<M:0>*2^{N-M}+C'<N-M:0>-2^{N-M-1},$$

wherein
R<N:0> represents the generated digital output code;
B'<M:0> represents the first set of bits;
C'<N-M:0> represents the second set of bits,
and:

$$X<y:0>=\Sigma_{i=0}^{y}X(i)\cdot 2^{i}.$$

9. The method of claim 7, comprising:
assigning a weight to a Least Significant Bit (LSB) of the first binary code; and
assigning the same weight to a Most Significant Bit (MSB) of the second binary code.

10. The method of claim 7, comprising:
generating a third set of bits based on a third series of comparisons of the output of a digital-to-analog converter with an analog input voltage, wherein:
the first set of bits does not change in response to the third series of comparisons or the third set of bits; and
the digital output code is based on the first set of bits, the second set of bits, the third set of bits, and the constant term representative of the voltage shift.

11. The method of claim 7, comprising:
conveying said first set of bits on a first digital bus and conveying said second set of bits on a second digital bus separated from the first digital bus.

12. A system, comprising:
a digital-to-analog converter comprising first and second digital-to-analog conversion circuits, a voltage shifter and an adder;
a comparator having:
a first input terminal, which, in operation, receives an analog input voltage;
a second input terminal, which, in operation, receives an output of the digital-to-analog converter; and
an output terminal, which, in operation, outputs a first series of results of comparisons of the analog input voltage to the output of the digital-to-analog converter and a second series of results comparisons of the analog input voltage to the output of the digital-to-analog converter; and
control logic which, in operation:
generates a first binary code to input to the first digital-to-analog conversion circuit through a first digital bus;
generates at least a second binary code to input to the second digital to analog conversion circuit through a second digital bus;
generates a control signal which, in operation, causes the voltage shifter to apply a voltage shift to the adder between the first set of comparisons and the second set of comparisons;
generates a first set of bits based on the first series of results;
generates a second set of bits based on the second series of results, wherein the first set of bits does not change in response to the second series of results or the second set of bits.

13. The system of claim 12 wherein said digital-to-analog converter comprises capacitive-resistive circuitry including capacitive upper arrays, capacitive lower arrays and a resistive sub-lower array.

14. The system of claim 12, comprising post-processing logic which, in operation, generates bits of a digital output code corresponding to the analog input voltage based on the first set of bits, the second set of bits and a constant value representative of the voltage shift applied to the adder.

15. The system of claim 12 wherein the control logic, in operation,
assigns a weight to a Least Significant Bit (LSB) of the first binary code;
assigns the same weight to a Most Significant Bit (MSB) of the second binary code.

16. A device, comprising:
an input, which, in operation, receives results of comparisons of an analog input voltage to an output of a digital-to-analog converter; and
circuitry coupled to the input, which includes first and second digital-to-analog conversion circuits, a comparator, a voltage shifter and an adder, and which, in operation:
generates a first set of bits based on a first series of comparisons of the output of the digital-to-analog converter with the analog input voltage;
generates a second set of bits based on a second series of comparisons of the output of the digital-to-analog converter with the analog input voltage, wherein the generated first set of bits does not change based on the second series of comparisons or the second set of bits; and generates bits of a digital output code corresponding to the analog input voltage based on the first set of bits, the second set of bits and a constant value representative of a voltage shift introduced in the digital-to-analog converter between the first series of comparisons and the second series of comparisons.

17. The device of claim 16 wherein the digital output code is based on the following formula:

$$R<N:0>=B'<M:0>*2^{N-M}+C<N-M:0>-2^{N-M-1},$$

wherein
R<N:0> represents the generated digital output code;
B'<M:0> represents the first set of bits;
C<N-M:0> represents the second set of bits,
and:

$$X<y:0>=\Sigma_{i=0}^{y}X(i)\cdot 2^{i}.$$

18. The device of claim 16, comprising:
a comparator, which, in operation, compares the analog input voltage to the output of the digital to analog converter; and
the digital-to-analog converter, wherein the circuitry, in operation:
applies a first binary code having M+1 bits to a first digital-to-analog conversion circuit of the digital-to-analog converter, M being an integer greater than 1 and the first set of bits being a set of M+1 bits; and
applies a second binary code having N−M+1 bits to a second digital-to-analog conversion circuit of the digital-to-analog converter, N being an integer greater than M and the second set of bits being a set of N−M+1 bits.

19. The device of claim 18 wherein the circuitry, in operation, generates a signal to cause the voltage shifter to apply the voltage shift to the adder after the first series of comparisons.

\* \* \* \* \*

UNITED STATES PATENT AND TRADEMARK OFFICE
CERTIFICATE OF CORRECTION

PATENT NO.      : 9,667,268 B2
APPLICATION NO. : 15/253348
DATED           : May 30, 2017
INVENTOR(S)     : Francesca Girardi et al.

It is certified that error appears in the above-identified patent and that said Letters Patent is hereby corrected as shown below:

On the Title Page

Item (73):
"ST Microelectronics International M.V., Amsterdam (NL)" should read,
--ST Microelectronics International N.V., Amsterdam (NL)--.

In the Claims

Column 14, Line 62 Claim 2:
"C<N-M:0> represents the second segment of confirmed" should read, --C'<N-M:0> represents the second segment of confirmed--.

Column 14, Line 65 Claim 2:
"X<y:0>=$\Sigma_{i=0}^{y} X(i) \cdot 2^i$." should read, --$X<y:0> = \sum_{i=0}^{y} X(i) \cdot 2^i$--.

Column 15, Line 55 Claim 8:
"X<y:0>=$\Sigma_{i=0}^{y} X(i) \cdot 2^i$." should read, --$X<y:0> = \sum_{i=0}^{y} X(i) \cdot 2^i$--.

Column 17, Line 13 Claim 17:
"R<N:0> = B'<M:0>*$2^{N-M}$ + C<N-M:0> - $2^{N-M-1}$," should read,
--R<N:0> = B'<M:0>*$2^{N-M}$ + C'<N-M:0> - $2^{N-M-1}$,--.

Column 17, Line 17 Claim 17:
"C<N-M:0> represents the second set of bits," should read, --C'<N-M:0> represents the second set of bits,--.

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)

U.S. Pat. No. 9,667,268 B2

Column 17, Line 19 Claim 17:

"$X{<}y{:}0{>}=\Sigma_{i=0}^{y}X(i)\cdot 2^{i}$." should read, -- $X{<}y{:}0{>} = \sum_{i=0}^{y} X(i) \cdot 2^{i}$. --.